United States Patent [19]

Janssens et al.

[11] Patent Number: 5,473,282
[45] Date of Patent: Dec. 5, 1995

[54] AUDIO AMPLIFIER ARRANGEMENT

[75] Inventors: Jan. A. M. Janssens; Frank C. H. Daems, both of Leuven/Heverlee, Belgium; Eise C. Dijkmans; Johannes A. T. M. Van Den Homberg, both of Eindhoven, Netherlands

[73] Assignee: U.S. Philips Corporation, New York, N.Y.

[21] Appl. No.: 371,044

[22] Filed: Jan. 10, 1995

Related U.S. Application Data

[63] Continuation of Ser. No. 198,240, Feb. 18, 1994, abandoned.

[30] Foreign Application Priority Data

Feb. 22, 1993 [EP] European Pat. Off. ............. 93200491

[51] Int. Cl.$^6$ ..................................................... H03F 1/30
[52] U.S. Cl. ............................................ 330/289; 330/298
[58] Field of Search .................................. 330/284, 285, 330/289, 298, 304; 381/120, 121

[56] References Cited

U.S. PATENT DOCUMENTS 4,438,411 3/1984 Rubin et al. ............................ 330/289
4,994,757 2/1991 Bickley et al. ........................ 330/285
5,331,291 7/1994 D'Agostino et al. .................. 330/289

Primary Examiner—Steven Mottola
Attorney, Agent, or Firm—Laurie E. Gathman

[57] ABSTRACT

A first signal processor stage of an audio amplifier arrangement influences the signal strength of a received audio signal for at least part of the frequency range of the received audio signal. An output amplifier stage amplifies the audio signal influenced by the first signal processor stage. The audio amplifier arrangement further includes a transformer having a primary winding connectable to a mains voltage and having a secondary winding connected to an AC/DC converter whose outputs are connected to at least the output amplifier stage for feeding the output amplifier stage. A detection circuit generates a detection signal (Vms) which is related to the power load of the transformer. An analysis circuit detects in response to the detection signal whether the rise in temperature occurring in the transformer due to the power load has exceeded a specific norm. The analysis circuit includes a control circuit for reducing the signal strength of the received audio signal for at least the part of the frequency range in the case where a transgression of the norm is detected.

10 Claims, 4 Drawing Sheets

AUDIO AMPLIFIER ARRANGEMENT

This is a continuation of application Ser. No. 08/198,240, filed Feb. 18, 1994, now abandoned.

FIELD OF THE INVENTION

The invention relates to an audio amplifier arrangement, having at least an audio signal input for receiving an audio signal, a first signal processor stage for influencing the signal strength of the received audio signal for at least part of the frequency range of the received audio signal, an output amplifier stage for amplifying an audio signal influenced by the first signal processor stage, a transformer having a primary side connectable to a mains voltage and a secondary side connected to an AC/DC converter. The outputs of the AC/DC converter being connected to at least the output amplifier stage for supplying a supply voltage to the output amplifier stage.

DESCRIPTION OF THE PRIOR ART

Arrangements of this type are widely known. The magnitude of the output power that can be supplied by the audio amplifier arrangement for a long period of time is mainly determined by the loading capacity of the transformer used. For that matter, with a given power load of the transformer, the temperature stabilizes at a value which is lower as the loading capacity of the selected transformer is greater. To avoid the temperature in the transformer rising above the maximum permissible temperature in the event of a long-term high output power, generally a transformer is selected which is sufficiently large to supply the desired power for a long period of time. The output power of an audio amplifier arrangement, and thus the power load of the transformer, strongly depends on a number of varying circumstances, such as: the dynamic in a reproduced track, the impedance of the loudspeakers used and the set sound volume. In extreme cases the circumstances may be such that the temperature of the transformer rises to beyond the permissible limit, causing the transformer to break down.

SUMMARY OF THE INVENTION

It is an object of the invention to provide an audio amplifier arrangement which makes a higher power supply possible without this resulting in a breakdown of the transformer.

According to the invention this object is achieved by an audio amplifier arrangement as defined in the opening paragraph, characterized in that the arrangement comprises a detection circuit for generating a detection signal related to the power load of the transformer, an analysis circuit for establishing, in response to the detection signal, whether the rise in temperature caused by the power load in the transformer has exceeded a specific standard, the analysis circuit comprising control means for reducing the signal strength of the received audio signal for at least the part of the frequency range in the case where a transgression of the standard has been established.

The invention is likewise based on the recognition that the temperature in the transformer is mainly determined by the power load of the transformer in its recent history.

In response to a detection signal which is related to this power load, an indication may also be obtained about whether the temperature in the transformer threatens to become too high and, subsequently, the power load of the transformer can be reduced by reducing the signal strength. As a result, an actual transgression of the maximum permissible temperature is avoided.

Therefore, the arrangement according to the invention permits the supply of high powers as long as this is permissible for the temperature of the transformer. This means that a relatively small transformer will suffice for a given maximum output power of the output amplifier stage. In the arrangement according to the invention the output power of the output amplifier is affected only under extreme conditions which rarely occur, but which do require a transformer capable of coping with a high power load in the state-of-the-art arrangements, whereas under normal operating conditions the output power is not affected.

The power supplied to the primary side of the transformer can be taken as a measure for the power load of the transformer. Alternatively, it is possible to take the power extracted from the transformer on the secondary side of the transformer as a measure of the power load. A measure which is highly attractive because of its simple detectability is the power extracted from the AC/DC converter by the output amplifier stage.

When reducing the signal strength for a reduction of the power load, it will be sufficient to reduce the signal strengths of the signal components that represent the low tones in the audio signal. For that matter, the power necessary for reproducing these tones is large compared with the power necessary for reproducing the higher tones.

However, it is also possible, by reducing the sound volume, to reduce the signal strength of the audio signal over the whole audio spectrum in lieu of reducing the low-frequency components.

BRIEF DESCRIPTION OF THE DRAWINGS

The invention will be explained hereafter with reference to the drawings which include FIGS. 1 through 6, in which.

DETAILED DESCRIPTION OF THE PREFERRED EMBODIMENTS

Figure 1:
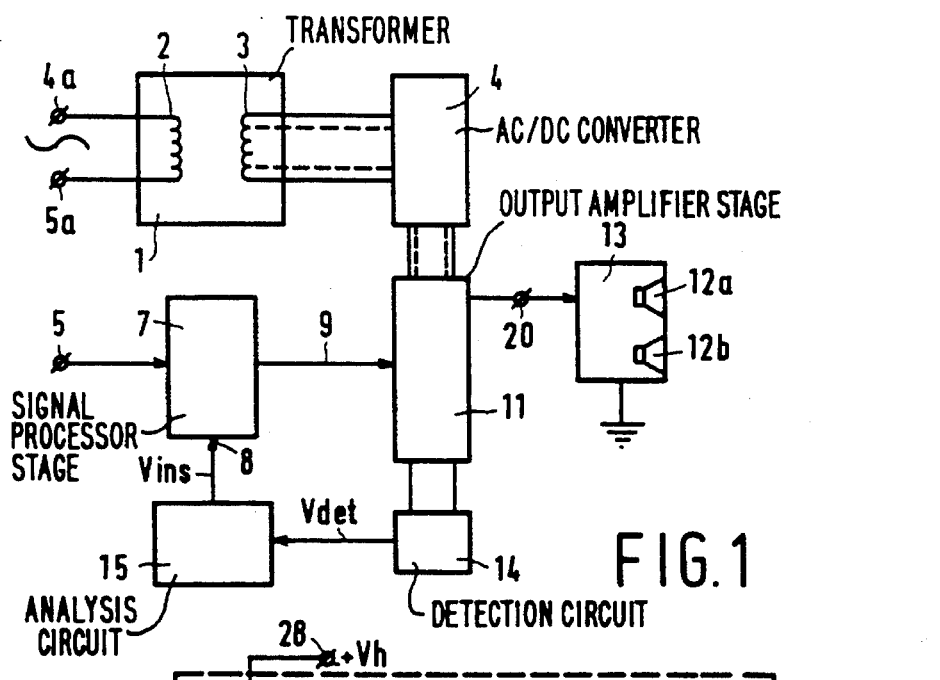
FIG. 1 shows an embodiment for an audio amplifier arrangement according to the invention.

FIG. 1 shows an embodiment for the arrangement according to the invention. Reference character 5 denotes an audio signal input for the reception of an audio signal. The audio signal input 5 is connected to a signal processor stage 7. The signal processor stage 7 is of a customary type for influencing the signal strength of the audio signal received through input 5. The degree of influence can be set by a setting signal Vins, which can be supplied through the set input 8. The influence may be a sound volume control for controlling the signal strength of all the signal components in the whole audio spectrum. The influence, however, may also be a so-called tone control in which the signal strength is adjusted for part of the audio spectrum. The audio signal influenced by the processor stage 7 is applied to an output amplifier stage 11 over signal line 9. The output amplifier stage 11 is of a customary type amplifying the supplied audio signals and applying them v/a an output terminal 20 to electroacoustic converters 12a and 12b of a loudspeaker box 13.

Furthermore, reference character 1 in FIG. 1 denotes a transformer comprising a primary winding 2 and a secondary winding 3. The primary winding 2 can be connected to an AC network, for example, a 220 V 50 Hz AC network, v/a terminals 4a and 5a. The secondary winding 3 is connected to an AC/DC converter 4 of a customary type for the supply of a supply voltage to the output amplifier stage 11.

The audio amplifier arrangement further includes a detection circuit for generating a detection signal related to the power load of the transformer 2. In the embodiment shown in FIG. 2 the detection circuit comprises a detection circuit 14 for deriving a detection signal that is indicative of the power extracted from the AC/DC converter 4 by the output amplifier stage 11. Generally, the converter 4 supplies, in addition to supplying power to the output amplifier stage 11, also power to other circuits of the audio amplifier arrangement. However, the electric power extracted from the converter 4 by the other circuits is negligibly small compared to the power extracted by the output amplifier stage 11. The power extracted from the converter 4 by the output amplifier stage 11 is indicative of the power supplied by the converter 4 and thus also indicative of the power load of the transformer. (Power load is meant to be understood here as the power transferred by the transformer from the primary to the secondary side).

The dissipated electrical energy in the transformer 1 is largely determined by the power load. The rise in temperature caused by this dissipation can thus be derived from the power load. In the embodiment shown in FIG. 1 the power extracted from the converter by the output amplifier stage 11 is taken as an indication for the measure of the power load. It will be evident to those skilled in the art that it is also possible to obtain an indication of the power load by measuring the power extracted on the primary side of the transformer 1 or the power supplied on the secondary side of the transformer 1.

A suitable analysis of the detection signal may disclose whether the temperature in the transformer threatens to become too high. An analysis circuit performing this analysis is denoted in FIG. 1 by reference character 15. Possible embodiments for the analysis circuit 15 will be discussed hereafter in the description. If, based on the analysis performed by the analysis circuit 15, there is established that the temperature in the transformer 1 threatens to rise too much, the analysis circuit 15 applies to the processor stage 7 a setting signal Vins through the setting input 8, so that the signal strength of the audio signals applied to the output amplifier stage over the signal lines 8 and 9 is reduced for at least part of the audio spectrum. As a result, the power extracted from the converter 4 by the output amplifier stage 11 will diminish as will, therefore, the power dissipated in the transformer 1. All this leads to the temperature falling to a lower final value and thus the avoidance of a transgression of the maximum permissible transformer temperature.

Figure 2:
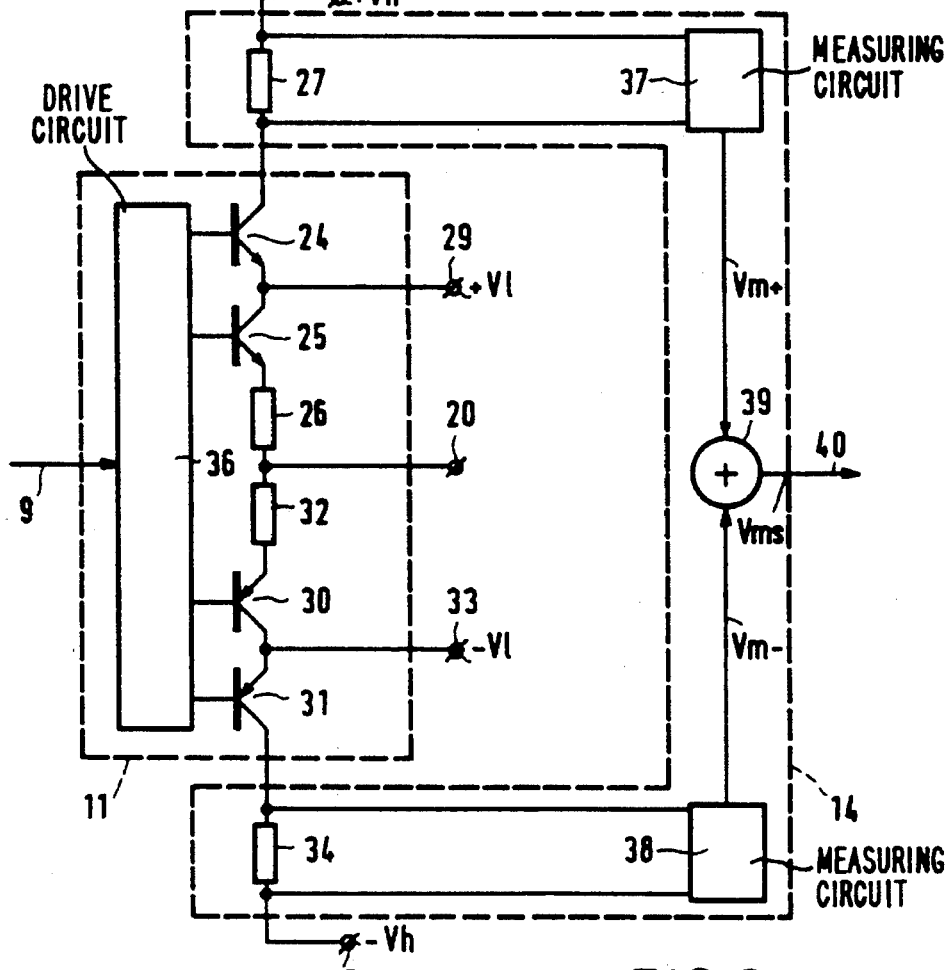
FIG. 2 shows an embodiment for an output amplifier stage and an embodiment for a detection circuit to be used in the audio amplifier arrangement.

FIG. 2 shows an embodiment for the output amplifier stage 11 combined with an embodiment for the associated detection circuit 14. The output amplifier stage 11 is a so-called class-G amplifier. The power section of such a class-G amplifier comprises a first series combination of NPN-power transistors 24, 25 and an emitter resistor 26. Furthermore, the power section includes a second series combination formed by PNP power transistors 30, 31 and an emitter resistor 32. The emitter of the transistor 25 is connected to the output terminal 20 via the emitter resistor 26. The collector of the transistor 25 is connected to the emitter of the transistor 24. The junction between the emitter of the transistor 24 and the collector of the transistor 25 is connected to a supply terminal 29 which carries a relatively small positive supply voltage +V1 supplied by the converter 4. The collector of the transistor 24 is connected, via a measuring resistor 27, to a supply terminal 28 which carries a relatively large positive supply voltage +Vh which relatively large positive supply voltage is also supplied by the converter 4.

The emitter of the transistor 30 is connected to the output terminal 20 via the emitter resistor 32. The collector of the transistor 30 is connected to the emitter of the transistor 31. The junction between the emitter of the transistor 31 and the collector of the transistor 30 is connected to a supply terminal 33 which carries a relatively small negative supply voltage −V1 supplied by the converter 4. The collector of the transistor 31 is connected, via a measuring resistor 35, to a supply terminal 35 which carries a relatively large negative supply voltage −Vh supplied by the converter 4. The bases of the transistors 24, 25, 30 and 31 are connected to a customary drive circuit 36. The drive circuit 36 is one of a type customarily used for driving the power transistors in a class-G amplifier. If such a drive is used, the transistors 24 and 31 continue to be in a non-conductive state if the audio signal received over signal line 9 has a low signal strength, and the output current is fed to the output terminal 20 solely by the transistors 25 and 30. For larger strengths of the audio signal which exceed the supply voltages +V1 and −V1, the output current to the output terminal 20 is supplied through all four power transistors 24, 25, 30 and 31. The manner in which the power transistors 24, 25, 30 and 31 are driven, does not form part of the invention and is therefore limited here to the outlined description given hereinbefore.

The measuring resistors 27 and 34 form part of the detection circuit 14. The two terminals of the measuring resistor 27 are connected to a measuring circuit 37. The measuring circuit 37 is of a customary type producing a measuring signal Vm+, which signal is indicative of the voltage drop across the measuring resistor 27 and is thus indicative of the current flowing through the measuring resistor 27. The terminals of the measuring resistor 34 are connected to a measuring circuit 38 which generates in similar fashion to measuring circuit 37 a measuring signal Vm− that is indicative of the current passing through the measuring resistor 34. The measuring signals Vm− and Vm+ are added together by an adder circuit. A detection signal formed by a detection voltage Vms that is indicative of the summed measuring signals Vm+ and Vm− is supplied by the adder circuit 39 over a circuit line 40.

Since the supply voltages −Vh and +Vh are equally large, the sum of the currents flowing through the measuring resistors, which is indicated by the detection voltage Vms, is a measure for the power extracted from the converter 4. For large signal strengths of the audio signal for which the transistors 24 and 31 are mined on, the detection voltage Vms denotes the total power extracted from the converter 4 by the output amplifier stage 11.

For small signal strengths, for which the transistors 24 and 31 are not turned on, the currents passing through the measuring resistors are equal to zero. The detection signal Vms then no longer indicates the power extracted from the converter 4 by the output amplifier stage 14. In the case where the audio signal is so small that the transistors 24 and 31 are not turned on, however, the power extracted from the converter 4 is relatively low. For these low power levels the dissipation in the transformer 1 is also relatively low, so that these powers have relatively little influence on the temperature in the transformer 1. This means that for an analysis whether the transformer temperature threatens to become too high, it will be sufficient to know the power values extracted from the converter 4 by the transistors 24 and 31.

The embodiment for the output amplifier stage described hereinbefore is a so-called class-G amplifier. It will be obvious to the expert that the invention is not restricted to amplifiers of this class, but that the invention is equally well applicable to amplifiers of a different class.

Figure 3:
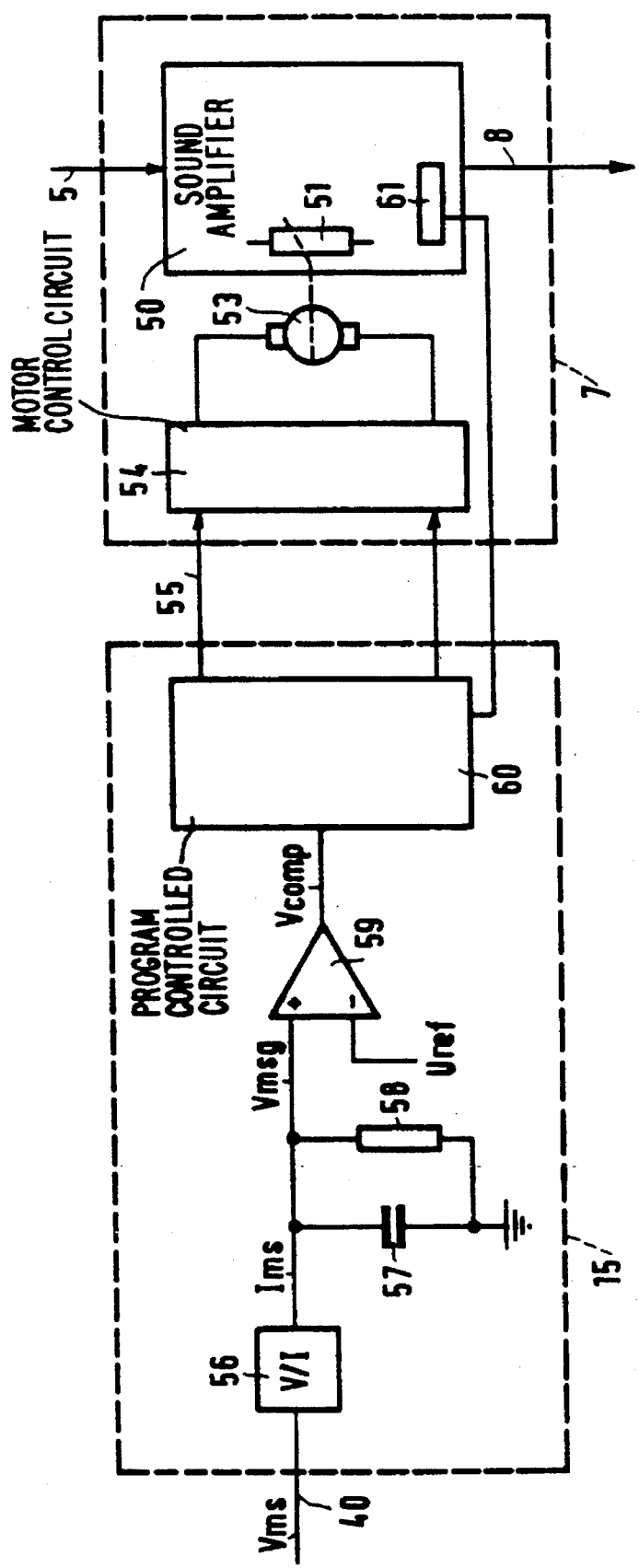
FIG. 3 shows an embodiment for an analysis circuit and an embodiment for a signal processor stage to be used in the audio amplifier arrangement according to the invention.

FIG. 3 shows an embodiment for the analysis circuit 15 combined with an embodiment for the processor stage 7.

The processor stage 7 comprises a sound volume control of a customary type. The sound volume control comprises an amplifier 50 whose gain factor can be set by a controllable resistor 51. The controllable resistor 51 is mechanically coupled to a turnable sound volume control on the operating panel of the audio amplifier arrangement. In the embodiment described here the sound volume control is further mechanically coupled to an electromotor 53. The motor control and hence the gain factor can be adapted by a motor control circuit 54. The motor control circuit used may be one of a customary type which changes the position of the motor by a step in a predetermined direction in response to a control signal received through a control signal input 55.

Figure 4:
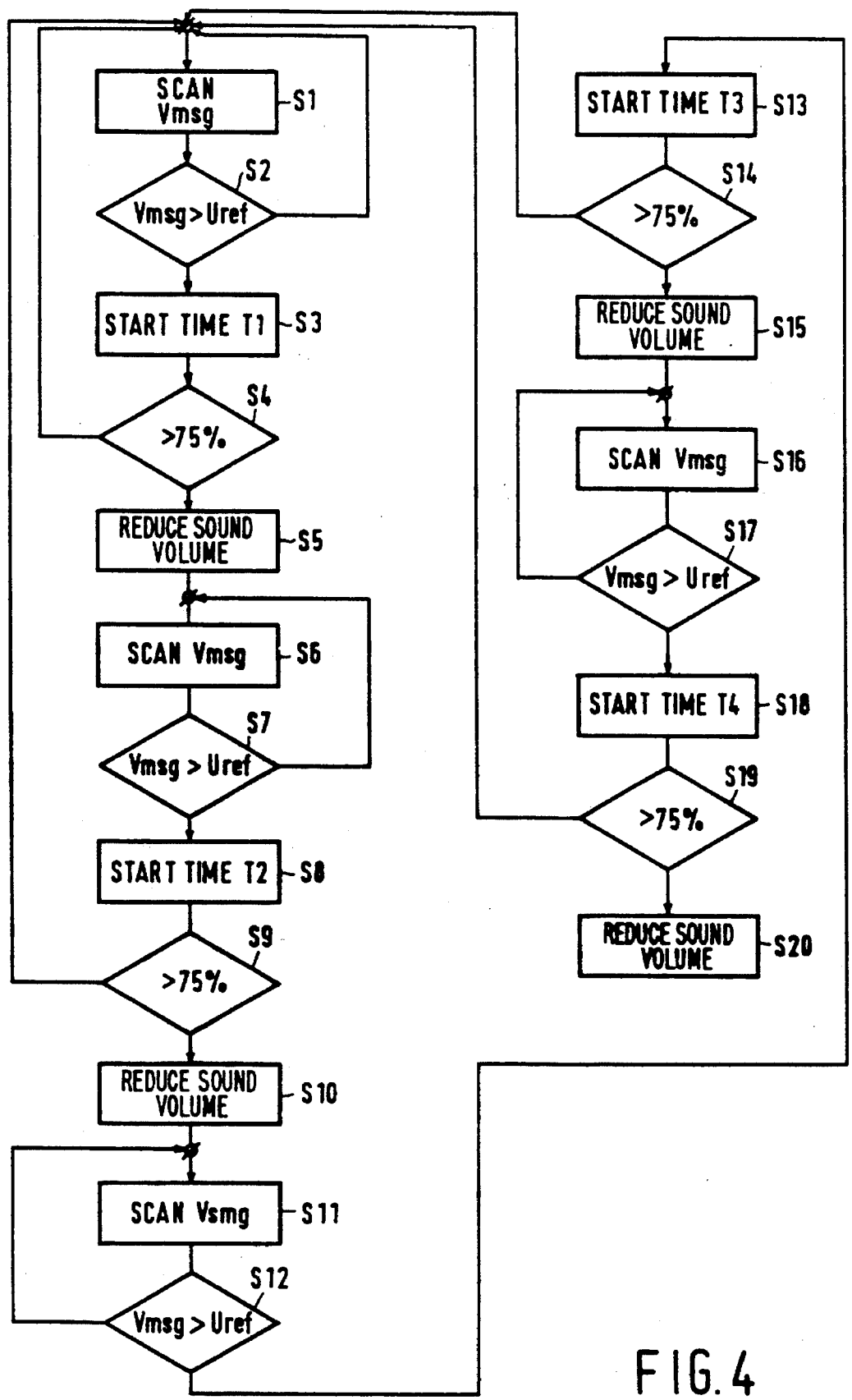
FIG. 4 shows a flow chart of a program executed by the analysis circuit, FIG. 5 gives an illustration of the behavior of the transformer temperature plotted against time for an audio amplifier arrangement according to the invention.
Figure 5:
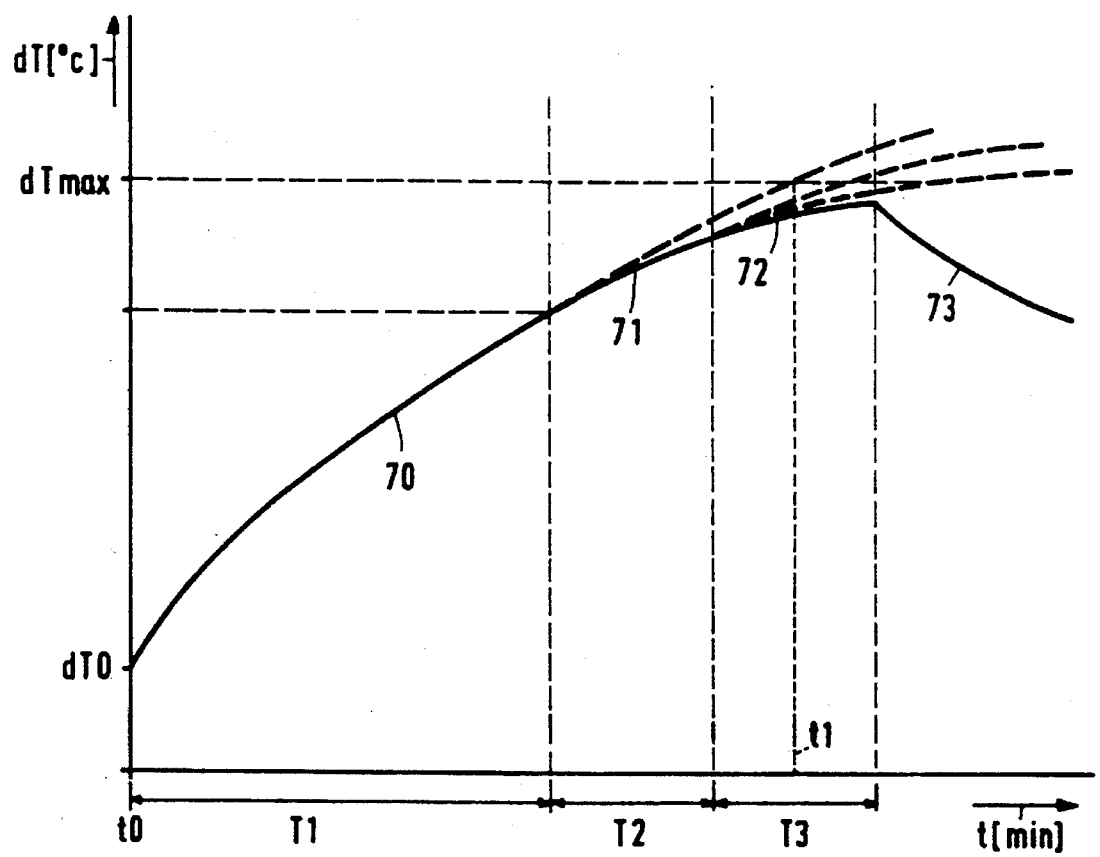

The analysis circuit shown in FIG. 3 comprises a voltage-to-current converter 56 which converts the detection voltage Vms to an associated detection current Ims. The detection current is supplied to capacitor 57 across which a resistor 58 is connected in parallel. The voltage Vmsg across the capacitor 57 is a measure for the mean value of the detection voltage Vms. The combination of voltage/current converter 56, capacitor 57 and resistor 58 in fact forms a low-pass filter for the detection voltage Vms. Therefore, it will be evident to a person skilled in the art that also different kinds of low-pass filters can be used for determining the mean value of the detection voltage. The voltage Vmsg is compared to a reference voltage Uref by a comparator circuit 59. The comparator circuit 59 produces a binary output signal Vcomp which indicates whether the voltage Vmsg has exceeded the reference voltage Uref. The voltage Vcomp is applied to a program-controlled circuit 60, for example, formed by a microprocessor which comprises a suitable program for performing a further analysis to establish whether the temperature of the transformer 1 threatens to become too high. A flow chart of a suitable program is shown in FIG. 4. The program comprises a step S1 in which the signal value of the output signal Vcomp is written. Then, in step S2, based on the written signal value, there is detected whether the voltage Vmsg has exceeded the reference voltage. If it has, this means that the power extracted from the converter 4 by the output amplifier stage 11 has exceeded a value determined by the reference voltage and this indicates that the dissipation in the transformer 1 has reached a certain limit. The value of Uref is selected so that the transformer temperature will not reach its maximum permissible level when the power determined by this reference voltage is extracted from the converter for a rather long period of time. If, in step S2, it is detected that Vmsg is lower than the reference voltage Uref, step 1 will be carried out once more after step S2. However, once it has been detected in step S2 that Vmsg has exceeded the reference voltage, step S2 will be followed by step S3. In step S3 there is tested, at equidistant instants, for a time interval T1, for example, 12 minutes in length for example, four seconds apart, whether the voltage Vmsg has exceeded the reference voltage Uref. In addition, the number of times there has been detected during a test that the reference voltage is exceeded, are counted. After time interval T1 has elapsed, step S4 is executed. In this step a test is made whether the number of times a transgression of the reference voltage has been detected has exceeded a given reference number of times. This reference number of times is selected so that the maximum permissible temperature will not be reached with a long-term power load of the transformer which corresponds to this number of reference voltage transgressions. This reference number may be equal, for example, to 75% of all the tests carried out in time interval T1. In the case where the reference number of times is not exceeded, there is no danger of the maximum permissible temperature to be exceeded. In that case, step S4 is followed by step S1, after which the part of the program is run once more. If the reference number is exceeded indeed, there is a danger of the maximum permissible temperature being exceeded and in that case the power load is to be reduced. FIG. 5 shows by way of illustration by a curve 70 the pattern of the rise in temperature dT of the transformer relative to the ambient temperature plotted against time t for the case where the power load of the transformer is so large that the maximum permissible temperature threatens to be exceeded. The maximum permissible rise in temperature is referenced dTmax. dTo denotes the rise in temperature as it is for an average use of the audio amplifier arrangement. At instant t0 the power load of the transformer is strongly increased, for example, by an increase of the set sound volume. With long-term operation of the audio amplifier arrangement in this system, the maximum permissible rise in temperature threatens to be exceeded at instant t1. To avoid such a transgression, step S4 will be followed by step S5 if in step S4 the reference number is found to be exceeded. In step S5 the sound volume control is reduced by applying to the control signal input 55 of the motor control circuit a control signal in response to which the sound volume control is reduced by a certain value by the motor 53. The reduction of the sound volume may be, for example, 2 dB, which corresponds to a power reduction of about 30%. The variation of the rise in temperature associated with this reduced power level is shown in FIG. 5 by curve 71. After the reduction of the sound volume in step S5, step S6 is executed. In step S6 the value of signal Vcomp is written once more. Then in step S7, there is detected in response to the written signal value of Vcomp whether the signal Vmsg has exceeded the reference voltage Uref. If Vmsg has not, step S7 is followed again by step S6. If Vmsg has, step S8 is executed. In this step there is tested, at equidistant instants, for a time interval T2 which is shorter than time interval T1 and is, for example, 4 minutes in length, whether the voltage Vmsg has exceeded the reference voltage Uref. In addition, the number of times there has been detected during a test that the reference voltage has been exceeded, are counted. Once time interval T2 has elapsed, step S9 is executed. In this step there is tested whether the number of times there has been established that the reference level has been exceeded, has exceeded a specific reference number. This reference number may again be equal to, for example, 75% of all the tests carried out in time interval T2. In the case where the reference number is not exceeded, there is no danger of the maximum permissible temperature being exceeded. In that case step S9 is followed by step S1 after which the part of the program described hereinbefore is run once more. In the case where the reference number is exceeded indeed, such as, for example in the case corresponding to curve 71 in FIG. 5, there is still the danger of the maximum permissible temperature being exceeded. In that case step S9 is followed by step S10 in which the sound volume is reduced by a certain value, for example, 2 dB. In FIG. 5 curve 72 represents the temperature pattern corresponding to this reduced sound volume.

After the reduction of the sound volume in step S10, step S11 is carried out. In step S11 the value of signal Vcomp is written again. Subsequently, in step S12, there is detected in response to the written signal value of Vcomp whether the signal Vmsg has exceeded the reference voltage Uref. If Vmsg has not, step S12 is followed again by step S11. If Vmsg has, step S13 is executed. In this step there is tested, at equidistant instants, for a time interval T3 which is shorter than time interval T1 and is, for example, 4 minutes in length, whether the voltage Vmsg has exceeded the reference voltage Uref. In addition, the number of times there has been detected during a test that the reference voltage has been exceeded, are counted. Once time interval T3 has elapsed, step S14 is executed. In this step there is tested whether the number of times there has been established that the reference level has been exceeded, has exceeded a specific reference number. This reference number may again be equal to, for example, 75% of all the tests carried out in time interval T3. In the case where the reference number is not exceeded, there is no danger of the maximum permissible temperature being exceeded. In that case step S14 is followed by step S1 after which the part of the program described hereinbefore is run once more. In the case where the reference number is exceeded indeed, such as, for example in the case corresponding to curve 72 in FIG. 5, there is still the danger of the maximum permissible temperature being exceeded and step S15 is executed in which the sound volume is reduced once more. In FIG. 5 curve 73 represents the temperature pattern corresponding to this reduced sound volume. In the example described here the temperature of the transformer drops after the sound volume has been reduced and the danger of the maximum permissible temperature of the transformer has ceased to exist.

Step S15 is followed by step S16. In step S16 the value of signal Vcomp is written again. Then, in step S17, there is detected in response to the written signal value of Vcomp whether the signal Vmsg has exceeded the reference voltage Uref. If Vmsg has not, step S17 is followed again by step S16. If Vmsg has, step S18 is executed. In this step there is tested, at equidistant instants, for a time interval T4 which is shorter than time intervals T2 and T3 and is, for example, 2 minutes in length, whether the voltage Vmsg has exceeded the reference voltage Uref. In addition, the number of times there has been detected during a test that the reference voltage has been exceeded, are counted. Once time interval T4 has elapsed, step S19 is executed. In this step there is tested whether the number of times there has been established that the reference level has been exceeded, has exceeded a specific reference number. This reference number may again be equal to, for example, 75% of all the tests carried out in time interval T4. In the case where the reference number is not exceeded, there is no danger of the maximum permissible temperature being exceeded. In that case step S14 is followed by step S1 after which the part of the program described hereinbefore is run once more. In the case where during the execution of step S19 the reference number is still exceeded, step S20 is executed. When this step is executed, amplifier 50 is brought to a so-termed mum state in which the sound volume is reduced to a given low setting value. This may be effected by a separate muting circuit 61 which directly affects the gain factor of the controllable amplifier 50 and sets this gain factor to a value that is independent of the gain factor determined by the controllable resistor 51. Once step S20 has been executed, the amplifier is preferably maintained in the mute state until the transformer has cooled down sufficiently.

Figure 6:
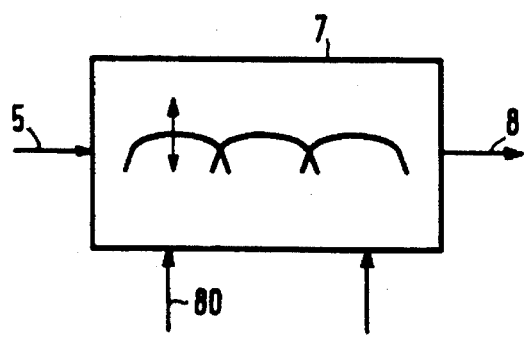
FIG. 6 shows a signal processor stage in the form of a tone control.

Them should be observed that the invention is not restricted to embodiments in which the analysis of the detection voltage Vms is made in the manner described above. For example, it is possible to reduce the sound volume by a value that depend on the degree to which the reference number is exceeded in lieu of a reduction of the sound volume by a constant value once a transgression of the reference number has been detected. Furthermore, it is alternatively possible to cream a dynamic temperature model of the transformer on the basis of which the temperature may be estimated based on the power extracted from the output amplifier stage as a function of time. Based on the estimated temperature constant checks can be made whether the sound volume is to be reduced to avoid the maximum permissible temperature being exceeded. In the embodiment shown in FIG. 3 the signal processor stage 7 comprises a variable gain amplifier. Instead, however, it is alternatively possible to use a signal processor stage formed by a tone controller by which the low-frequency contents (low tones) of the audio signal can be reduced electronically by a control signal applied to an appropriate control signal input 80 (see FIG. 6). Such tone controllers are known per se and will therefore not be further described in detail. A reduction of the low-frequency contents of the audio signal provides a considerable reduction of the power extracted from the converter 4 by the output amplifier stage 11. For that matter, the power necessary for reproducing the low tones is relatively large compared with the power necessary for reproducing the higher tones.

What is claimed is:

1. Audio amplifier arrangement, comprising:

an audio signal input for receiving an audio signal;

a signal processor stage for influencing the signal strength of the received audio signal for at least part of the frequency range of the received audio signal;

an output amplifier stage for amplifying the audio signal influenced by the first signal processor stage;

an AC/DC converter having outputs;

a transformer having a primary side for coupling to a mains voltage and a secondary side coupled to the AC/DC converter, the outputs of the AC/DC converter being coupled to at least the output amplifier stage for supplying a supply voltage to the output amplifier stage;

a detection circuit for generating a detection signal related to the power load of the transformer; and an analysis circuit for establishing, in response to the detection signal, whether the rise in temperature caused by the power load in the transformer has exceeded a specific standard, the analysis circuit comprising control means for causing the signal processor stage to reduce the signal strength of the received audio signal for at least the part of the frequency range in the case where a transgression of the standard has been established.

2. The audio amplifier arrangement as claimed in claim 1, wherein the detection circuit comprises detection means for detecting the power extracted from the AC/DC converter by the output amplifier stage.

3. The audio amplifier arrangement as claimed in claim 1, characterized in that the signal processor stage is a variable gain amplifier stage for amplifying the audio signal for the whole frequency range, the control means comprising means for reducing the gain factor when a transgression of the standard has been established.

4. The Audio amplifier arrangement as claimed in claim 1, characterized in that the signal processor stage is arranged for selectively adapting with an adjustable adaptation factor the gain factors of the audio signal in different frequency ranges, the control circuit comprising means for setting the adaptation factor for the low-frequency components in the audio signal to a value for which the strength of the low-frequency components is reduced.

5. The audio amplifier arrangement as claimed in claim 2, wherein the signal processor stage is a variable gain amplifier stage for amplifying the audio signal for the whole frequency range, the control means comprising means for reducing the gain factor when a transgression of the standard has been established.

6. The audio amplifier arrangement as claimed in claim 2, wherein the signal processor stage is arranged for selectively adapting with an adjustable adaptation factor the gain factors of the audio signal in different frequency ranges, the control circuit comprising means for setting the adaptation factor for the low-frequency components in the audio signal to a value for which the strength of the low-frequency components is reduced.

7. The audio amplifier arrangement as claimed in claim 1, wherein the detection circuit includes means for measuring power supplied to the primary side of the transformer.

8. The audio amplifier arrangement as claimed in claim 1, wherein the detection circuit includes means for measuring the power extracted from the secondary side of the transformer.

9. The arrangement as claimed in claim 1, wherein the signal processor stage influences the signal strength of the received audio signal for all of the signal components in the whole audio spectrum.

10. The arrangement as claimed in claim 1, wherein the secondary side of the transformer is connected to a first input of the AC/DC converter, and wherein an output of the signal processor stage is connected to a second input of the output amplifier stage and wherein the detection circuit is coupled to both the output amplifier stage and an input of the analysis circuit, the output of the analysis circuit being coupled to an input of the signal processor stage.

* * * * *